United States Patent [19]
Bower et al.

[11] Patent Number: 5,236,118
[45] Date of Patent: Aug. 17, 1993

[54] ALIGNED WAFER BONDING

[75] Inventors: Robert W. Bower, Davis; Mohd S. Ismail, West Sacramento, both of Calif.

[73] Assignee: The Regents of the University of California, Oakland, Calif.

[21] Appl. No.: 883,583

[22] Filed: May 12, 1992

[51] Int. Cl.$^5$ .................... H01L 21/02; H01L 21/324
[52] U.S. Cl. .................................... 228/193; 228/105; 228/231; 437/15; 437/51; 437/225
[58] Field of Search ............... 228/103, 105, 123, 193, 228/231; 437/15, 51, 56, 225; 148/33, 33.4

[56] References Cited

U.S. PATENT DOCUMENTS

| 4,700,466 | 10/1987 | Nakagawa et al. | 437/247 |
| 4,771,016 | 9/1988 | Bajor et al. | 437/21 |
| 4,939,101 | 7/1990 | Black et al. | 228/231 |

OTHER PUBLICATIONS

Advertisements and product brochures by Karl Suss America, Inc.
Lasky, J. B., "Wafer Bonding for Silicon-On-Insulator Technologies" Appl. Phys. Lett. Jan. 6, 1986.
Petersen, et al., "Silicon Fusion Bonding for Pressure Sensors", Solid-State Sensor and Actuator Workshop Technical Digest, Hilton Head Island, S.C., 1988.
Petersen, Kurt E., "Fabrication of an Integrated, Planar, Silicon Ink-Jet Structure" IEEE Transactions on Electric Devices, Nov. 1979.
Tenrez, et al., "Silicon Microcavities Fabricated with a new Technique", Electronic Letters, Apr. 18, 1986.
Bower, et al., "Silicon Nitride Direct Bonding", Electric Letters, Apr. 18, 1990.
Yasumoto, et al., "Promising New Fabrication Process Developed for Stacked LSI's" Technical Digest in IEEE Int. Electron Devices Mtg. Dec. 1984.
Little, et al., "The 3-D Computer", IEEE International Conference on Wafer Scale Integration, San Francisco, CA 1989.
Stengl, et al., "A Model for the Silicon Wafer Bonding Process", Jpn. J. Appl. Phys., 1989.
Stemme, "A CMOS Integrated Silicon Gas-Flow Sensor with Pulse-Modulated Out-Put" presented at Fourth International Con. On Solid-State Sensors and Actuators, Tokyo, Japan, Jun. 2-5, 1987.
Hirata et al., "Silicon Diaphragm Pressure Sensors Fabricated by Anodic Oxidation Etch Stop", Sensors and Actuators, 1990.
Smith, et al., "The Design and Fabrication of a Magnetically Aucuated Micromachined Flow Valve", Sensors and Actuators, 1990.
Smith, et al., Micromechanical Packaging for Chemical Microsensor's, IEEE Transactions on Electron Devices, Jun. 1988.
Smith, et al., "A Wafer-to-Wafer Alignment Technique", Sensors and Actuators, 1989.
Hayashi, et al., Fabrication of Three-Dimensional IC Using Cumulatively Bonded IC (CUBIC) Technology Symposium on VLSI Technology, Hawaii, 1990.

Primary Examiner—Samuel M. Heinrich
Attorney, Agent, or Firm—John P. O'Banion

[57] ABSTRACT

A process for precision alignment and bonding of complementary micromechanical, electrical and optical structures. Surface features of the structures are critically aligned and brought into physical contact within atomic dimensions to form direct bonds without the use of adhesives. The bonds are initially formed at room temperature and then strengthened by a high temperature anneal. Three dimensional structures may be formed in separate prefabricated layers rather than monolithically through the use of this process.

23 Claims, 6 Drawing Sheets

ALIGNED WAFER BONDING

BACKGROUND OF THE INVENTION

1. Field of the Invention

This invention pertains generally to the fabrication of semiconductor structures, and more particularly to a process for precision alignment and direct bonding of silicon based materials to mechanical, electrical, semiconductor and/or optical structures.

2. Description of the Background Art

Three dimensional semiconductor structures are commonly fabricated on substrates using conventional masking, doping and etching techniques to produce a monolithic structure. For example, a CMOS device is generally fabricated by forming both p-type and n-type channels on a p-type substrate. Some three dimensional structures, such as silicon on insulator devices, are fabricated by depositing a thin silicon film on an insulating sapphire substrate. While these techniques are suitable for many devices, some device technologies are highly complex, use incompatible processes, or suffer from undesirable parasitic elements when fabricated monolithically on a single substrate.

For example, it is difficult to fabricate monolithic npn and pnp bipolar transistors of high gain or speed on a single chip of semiconductor material. This results from the requirement that the base width and doping for either npn or pnp transistors must be carefully controlled to achieve high gain or speed. While it is relatively straightforward to carefully control either a p-type base in an npn or an n-type base in a pnp transistor, it is very difficult to achieve both in a single process sequence. The present invention overcomes this deficiency by allowing for fabrication of the npn and pnp portions of the structure on separate wafers where each transistor type can be optimized, and then providing for aligning and bonding the wafers to integrate the overall structure.

Non-aligned silicon direct bonding is a known technique which has been used in a "bond and etch back" process to create high purity silicon on insulator (SOI) material. The technique has been useful in bonding a single patterned wafer to bulk substrates to create working electrical and mechanical devices. However, a technique that allows for the precision alignment of two prefabricated surfaces with high accuracy has not been heretofore developed.

Device features consistent with electronic, optical or micromechanical structures often need to be bonded to a substrate material. Present techniques for bonding are limited to using adhesives which commonly suffer from contamination, or mechanical bonds such as solder pads. None of these techniques provide for critical alignment and bonding of the materials at the atomic level, wherein the bonds are similar to those within the crystals themselves and no additional adhesives are required. Therefore, there is a need for a process which permits independent fabrication of semiconductor structures and provides for subsequent precision aligned bonding for fabrication of an integrated device.

SUMMARY OF THE INVENTION

The present invention pertains to a process for fabricating semiconductor devices from separate structures instead of employing conventional monolithic fabrication techniques. In general terms, the process employs precision alignment procedures and direct silicon bonding. This produces three dimensional bonded layers that might include combinations of mechanical, electrical and/or optical elements formed in separate prefabricated layers.

By way of example and not of limitation, an array of orthogonal V-shaped grooves are etched into the surface of silicon based wafers. These V-shaped grooves, which can also simulate scribe lines in an application with embedded electrical, optical, or mechanical structures, are then precisely aligned through infrared imaging. The aligned wafers are then brought into physical contact for initial bonding. Subsequent high temperature annealing is then used to strengthen and complete the chemical bonding. Alternatively, specific device features on the surface of the wafer or other structure can be used as alignment marks. This technique can thus be employed for the precision alignment and bonding of complementary micromechanical, electrical, or optical structures during the formation of three dimensional devices.

The process of the present invention is not limited to direct bonding of silicon, but can also be applied to dissimilar substrates with compatible mechanical properties when a suitable intermediate material such as silicon nitride is used. Previously, wafers have been attached to one another in rough alignment using metal bumps or polyimide as adhesive material.

An object of the invention is to provide for precision alignment and direct silicon bonding of semiconductor structures.

Another object of the invention is to provide for precision alignment of independently fabricated semiconductor structures with accuracy of 5 micrometers or better.

Another object of the invention is to provide for fabrication of CMOS devices where the n- and p- channel wafers are fabricated separately, thus reducing process complexity, and providing technology which is dielectrically isolated and free of vertical latch up.

Another object of the invention is to provide for direct fusion bonding of dissimilar materials.

Another object of the invention is to provide for integration of electronic circuitry into microsensors.

Another object of the invention is to provide for integration of electronic circuitry into microactuators such as gears and switches.

Another object of the invention is to provide for iterative fabrication of multilayered devices.

Another object of the invention is to provide for direct fusion bonding of semiconductor chips.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DESCRIPTION OF THE PREFERRED EMBODIMENTS

Figure 1:
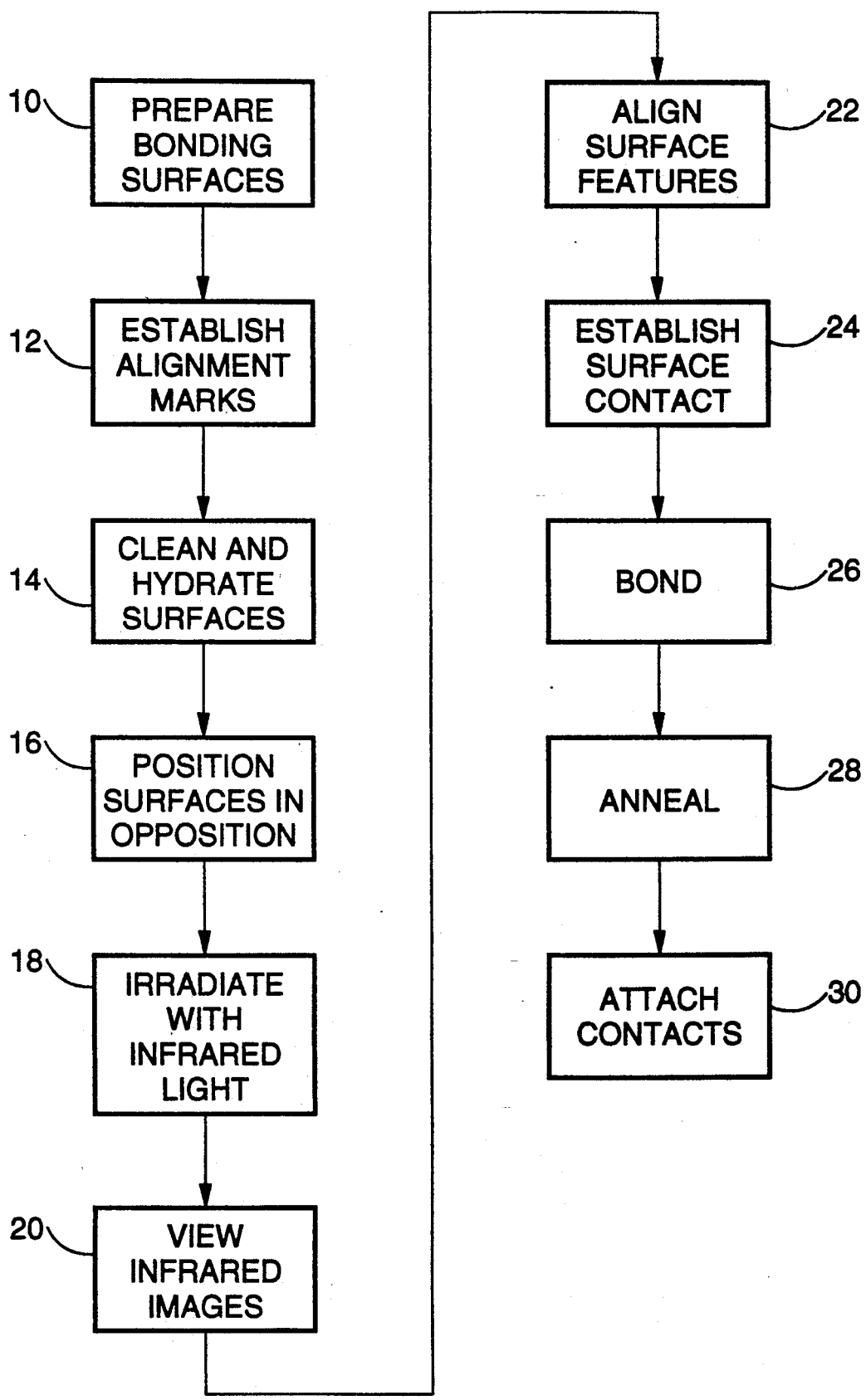
FIG. 1 is a flow diagram showing the general steps of the process of the present invention.

Referring more specifically to the drawings, for illustrative purposes the present invention is embodied in the process steps generally shown in FIG. 1. It will be appreciated that the process steps, and their sequence, may vary without departing from the basic concepts as disclosed herein.

The present invention generally comprises a process to bond surface features of silicon based materials without the use of adhesives. Atomic or crystalline bonds between the materials themselves are formed after precision alignment. This process will be referred to herein as Aligned Wafer Bonding.

Referring to FIG. 1, at step 10 the surfaces of the structures to be bonded are prepared. For Aligned Wafer Bonding of two silicon wafers, this step would involve polishing and cleaning the surfaces to be bonded. For other structures, particularly those which are not silicon based, this step would typically involve deposition of silicon based materials such as $SiO_2$, $Si_3N_4$, PtSi, $TiSi_2$ and polysilicon on the surfaces of the structures to be bonded as will be described in more detail herein.

Figure 2:
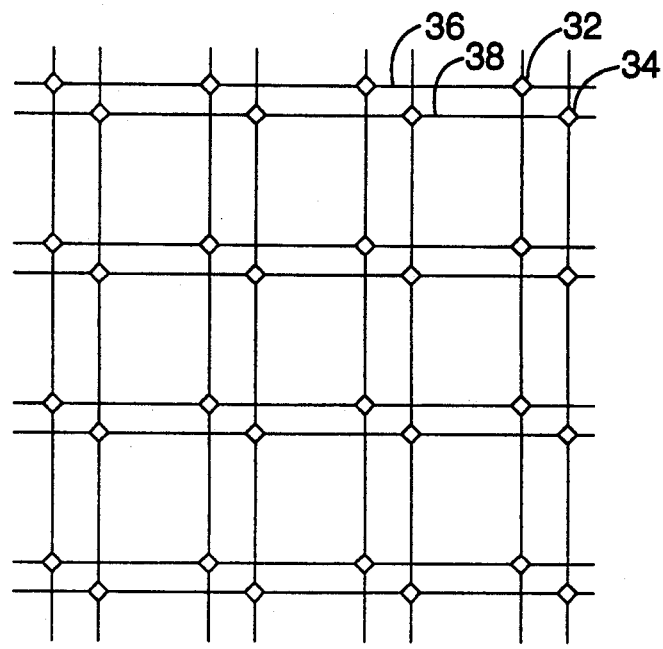
FIG. 2 is a diagrammatic view showing the positioning of one embodiment of alignment marks prior to superimposition.
Figure 3:
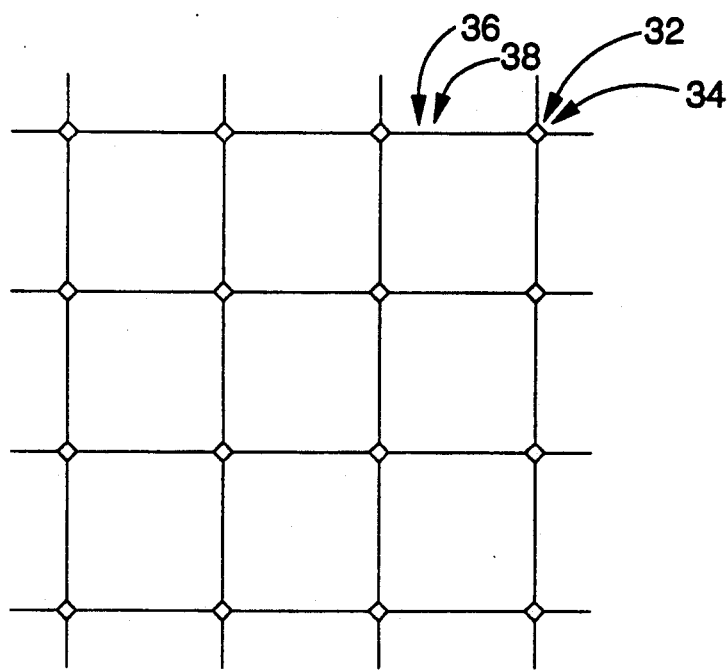
FIG. 3 is a diagrammatic view showing the alignment marks of FIG. 2 after superimposition.

At step 12, a plurality of alignment marks are established on the surfaces of the structures to be bonded. For example, silicon wafers to be bonded could be patterned with an array of orthogonal V-shaped grooves. Referring also to FIG. 2, V-shaped grooves 32, 34 on first and second wafers, respectively, and scribe lines 36, 38 on first and second wafers, respectively, represent a patterns of alignment marks on two separate wafers which are misaligned. FIG. 3 represents the same patterns of alignment marks after the surfaces of the wafers are aligned.

Alternatively, these alignment marks could be established as surface features of separately fabricated structures. The surface features could be used for alignment purposes only, or could be the actual surface features to be bonded. This is the preferred approach since Aligned Wafer Bonding is ideally suited for bonding complementary surface features on separately fabricated structures.

At step 14, the surface features to be bonded are cleaned and hydrated using conventional means. This step may be bypassed where, for example, silicide layers have been deposited during the fabrication process.

At step 16, the surface features to be bonded are positioned in direct opposition to each other so that the surfaces can be brought into contact.

At step 18, the structures are irradiated with infrared light for viewing with an infrared imaging apparatus. This step is required so that the alignment marks can be viewed simultaneously at step 20 to resolve any misalignment then present. At step 22, the surfaces are aligned by superimposing the alignment marks as precisely as possible, but generally within 2.5 to 5 micrometers.

At step 24, the surface features (or surfaces) of the structures are brought into physical contact at room temperature where atomic bonding or crystalline bonding occurs naturally and without the aid of adhesives. This can be achieved by creating a partial vacuum between the surfaces of the structures. For example, hydrogen bonds are established when the surfaces of silicon wafers are brought into intimate contact. These relatively weak bonds of 10.5 kcal/mol are sufficient to hold the two wafers firmly together without relative displacement during transportation to an annealing furnace.

At step 28, the structures are annealed at a high temperature to strengthen the bonds formed in step 26. Annealing at 950° C. for 30 min is sufficient for the formation of direct silicon bonds.

Finally at step 30, external contacts and leads are attached to the bonded structures for electrical connection to other devices.

Figure 4:
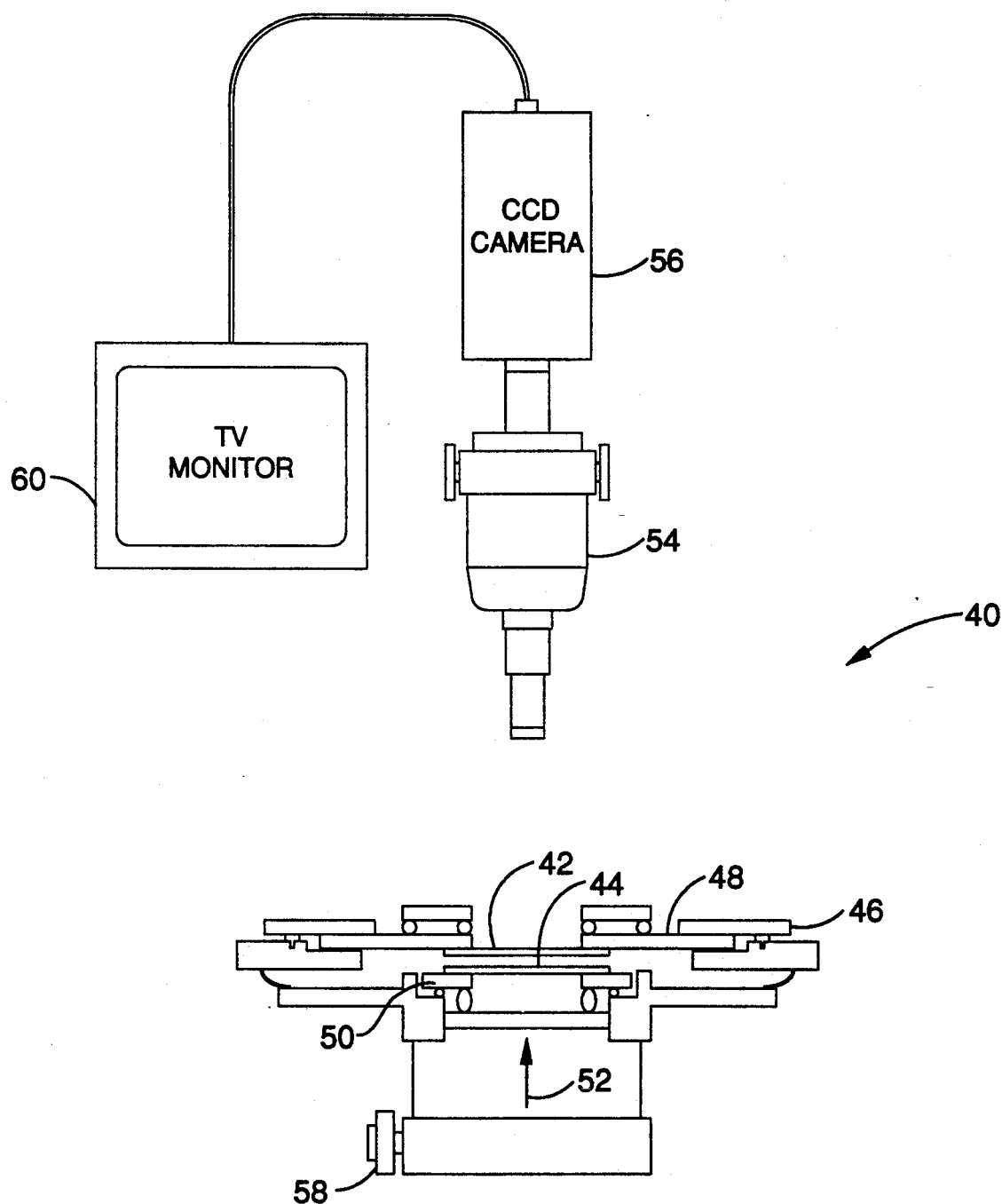
FIG. 4 is a schematic view showing one embodiment of an infrared alignment apparatus used with the process of FIG. 1.

Referring now to FIG. 4, steps 16 through 26 of FIG. 1 can be facilitated with the use of a modified Optical Associates Hyperline Model 400 Infrared Aligner, particularly where wafer surfaces are to be bonded. Those skilled in the art will appreciate that other devices and apparatus could also be used for this purpose.

The infrared aligner 40 was redesigned to hold two wafers 42, 44 with the surfaces to be bonded in a face-to-face orientation. A special fixture was retrofitted to the mask plate holder 46 to allow the edges of upper wafer 42 to be held in place by partial vacuum to the upper portion of the alignment 10 column 48. The bottom chuck plate of the substrate holder was replaced by an annular metal disk 50 designed to hold the lower wafer 44 under partial vacuum. Both upper and lower holders were reconstructed to allow infrared radiation 52 of wavelengths in the range of 1.0 to 1.2 micrometers to pass through the wafers 42, 44 to the microscope 54 and imaging camera 56 without additional absorbing media in the optical path between the infrared light source and the microscope 54. The infrared aligner's rotational and translational controls 58 are then used to bring the surface features of wafers 42, 44 into alignment while viewing the infrared images of the alignment marks on monitor 60. The vertical translational control of the bottom chuck is used to bring the focal planes of the two wafers into proximity so that an acceptably focused image of the two wafer surfaces may be viewed simultaneously.

For Aligned Wafer Bonding of silicon wafers, double sided polished silicon wafers are preferred to reduce the optical distortion caused by normal surface roughness on the backside of wafers. A pair of (100) oriented wafers can be patterned with an array of vertical and horizontal lines and V-shaped grooves were anisotropically etched with hot potassium hydroxide. Grooves approximately 100 micrometers wide with variable depths ranging from 10–50 micrometers have been found to provide high resolution scribe lines. The rotational and translation controls of infrared aligner 40 would be adjusted until the V-shaped groove lines appear to be superimposed on the monitor 60. In order to improve the alignment of the wafers, it is preferable to bring the focal planes of the wafers into close proximity and use high magnification with microscope 54.

As can be seen, relative displacement of the surface features to be bonded must be minimized or eliminated for successful Aligned Wafer Bonding. Preferably, scanning electron microscopy is used to determine the accuracy achieved during the alignment process. The pixel size of 7 micrometers at 2.25× magnification and 2 micrometers at 8.0×magnification is a typical limiting factor, however. It has been found that misalignment at 2.25×magnification is on the order of 10 micrometers. This can be reduced to approximately 2.5 micrometers at 8.0×magnification. At 8.0×magnification the degree of alignment can be improved by iteratively bringing the wafers into closer proximity and adjusting the focal plane of the optical system to improve the resolution of the magnified image. A typical sample is generally misaligned by less than 5 micrometers. It should also be noted that wafer flatness and surface roughness play important roles. Preferably the radius of wafer curvature should be greater than 60 meters for a 500 micrometer thick wafer with a surface microroughness of less than 10 Å.

The angle of the anisotropically etched (111) planes used as alignment marks also directly affects the precision of alignment achieved. The (111) planes that define the walls of V-grooves create a shadow image without the necessity of metal features commonly used for two sided backside alignment. Metal alignment features would be incompatible with post bonding processing. The (111) planes in the top wafer grooves refract the beam creating planes in the bottom grooves totally reflect the light creating a shadow with a width equal to the horizontal projection of the inclined wall. These dark regions replicate the geometric shape of the alignment features. Planar steps in silicon or thin film insulator layers were found not to produce an acceptable image conducive to precise alignment of the wafers. V-grooves of at least 30 micrometers in depth are required for visual alignment of the infrared image at high magnification due to the limits o the lens magnification in present systems. Alignment accuracy is constrained by an inability to project the upper and lower surface images onto a single focal plane.

A variety of signal processing techniques might improve both the image feature requirement and the resolution of the system. For example, the images of each wafer plane could be independently optimized and stored electronically, then combined to reduce distortion caused by the nonidentical focal planes of the wafers. A high resolution infrared detector/camera and differential image processor could be used to achieve more precise alignment.

Aligned Wafer Bonding as heretofore described has many applications. Using this technique, bonded three dimensional features can be positioned within tens of nanometers vertically and within the alignment tolerance horizontally. This allows device features consistent with electronic, optical or micromechanical structures to be combined between the bonded wafers. The process will provide for viable alignment to within 5 micrometers for standard silicon wafers with surface nonuniformity less than 20 micrometers. This alignment tolerance provides several potentially useful applications of aligned bonding such as pneumatic microvalves, field emission microtriodes, and a variety of silicon based sensors. Alignment accuracies to within approximately one micrometer should be possible with the improvements in imaging described. One micrometer aligned bonding would allow this technique to be applied to wafers with submicron technology since coupled features are typically not confined to the device dimensions. If we also align bond electronically communicating layers such as p-n junctions, p+or n+busses, or silicides, then three dimensional integrated circuits would be possible with Aligned Wafer Bonding. This would revolutionize integrated circuit fabrication since different sections of an integrated circuit could be separately fabricated and tested in a process optimized for each layer, then chosen by a yield map and aligned bonded together to enhance performance and yield. This process-specific approach would also apply to electrical, mechanical and optical systems and multimaterial devices such as Ge-Si and GaAs-Si, and the like. When this technique is combined with selective etch back, each new added layer could be fabricated, tested, bonded to the ensemble, and then thinned to produce a general three dimensional multilayered structure.

Specific materials which are ideal for bonding using the process of the present invention include Si, $SiO_2$, $Si_3N_4$, PtSi, $TiSi_2$, and polysilicon. Direct bonding of Si and $SiO_2$ is important in the formation of microstructures and silicon on insulator material. $Si_3N_4$ can be aligned bonded as an insulating material, while PtSi, $TiSi_2$, and polysilicon are temperature robust conductive materials which can be bonded as conductive materials.

Silicides and salicides can be bonded in the same fashion as silicon. The principle of this bonding technique is that many metal silicides tend to form $SiO_2$ on the surface of the material when exposed to an oxidizing ambient. In order to bond a silicide in this manner, a very thin $SiO_2$ layer is formed on the surface of the silicide by exposing the surface to a chemically oxidizing substance. This forms a very thin layer of $SiO_2$ which is sufficient to promote bonding but thin enough not to impair the electrical conduction across the bonded interface. This has been accomplished for PtSi and $TiSi_2$, and should apply to a variety of other silicides. The bond forms at room temperature and requires a high temperature anneal as is the case with silicon bonding.

Additionally, a bond can be formed by fusing silicon to metal to form a metal silicide and in the process bonding the wafers together. The advantage to this technique is that metal silicides form at temperatures as low as 175° C. for $Pd_2Si$ or as low as 350° C. for Ta-Si. This would be advantageous for bonding wafers which are restricted in temperature by organics or metals such as Aluminum when bonded. A problem that requires attention is that unless a room temperature prebond can be made, the alignment would have to take place at the final bond temperature.

PtSi and $TiSi_2$ bonding depends upon the principle of the formation of a hydrophilic layer on the surface of the material by exposing it to an oxidizing ambient. A very thin layer of $SiO_2$ forms on the surface and then allows direct wafer bonding to be accomplished. Once annealed, the bond forms a strong highly conductive connection between the materials. This bond is used as the principle mechanical and electrical connection between aligned bonded wafers of CMOS, Bi-CMOS, and other electrically interconnected structures.

An example of PtSi direct bonding follows. Silicon substrates, 3 inches in diameter, boron doped at 10 Ω cm, (100) orientation, are cleaned and etched in dilute HF prior to loading in an e-beam chamber. Pt is evaporated onto the substrates held at 350° C. where silicidation immediately occurs on deposition. The vacuum at deposition was $10^{-6}$ torr. A total thickness of 60 Å PtSi is thereby formed on the substrates. The resistivity of the film is approximately 30 $\mu\Omega$ cm. The wafers are then slightly etched in a 60° C. aqua regia solution of 3:1, $HCl:HNO_3$; this selectively etches Pt leaving only PtSi. After cleaning in base and acid baths, the wafers are rinsed and dried in a spin dryer. The cleaning agents normally create a thin oxide layer on silicon and some silicide surfaces, and the silicide surface is uniformly hydrophilic after the cleaning process. The hydrophilic surface is necessary but not a sufficient condition for the direct bonding process. The wafers are then brought into intimate contact where initial hydrogen bonds are formed. Bonding is established at room temperature for PtSi to PtSi surfaces and PtSi surfaces to hydrophilic silicon wafers in the form of relatively weak water hydrogen bonds of 10.5 kcal/mol. The bonds, however, are sufficient to hold the two wafers firmly together without relative displacement during the transport to the annealing furnace. Following the initial bonding, the wafer pairs are then annealed at 700° C. in an $N_2$ ambient for 2 hours to form direct silicide bonds. The bonding reaction is the same as for silicon or silicon dioxide surfaces as previously described. To form electrical contacts for external connections, aluminum is evaporated on both sides of the bonded PtSi-PtSi coated silicon wafer for metal contact. The coated wafers are then annealed at 450° C. in a forming gas of $Ar+4\% H_2$ for 30 minutes.

For $TiSi_2$ surface bonding, the $TiSi_2$ can be deposited on the wafer by cosputtering titanium and silicon followed by a silicidation process. For polysilicon to polysilicon bonding, polysilicon can be prepared by low pressure chemical vapor deposition followed by a phosphorus diffusion process. In each case, a cohesive bond for each of the deposited materials can be accomplished after 2 hours annealing at 900° C. in an inert ambient.

As can be seen, therefore, Aligned Wafer Bonding lends itself to fabrication of a variety of electrical, mechanical, and optical devices. For example, a p-channel MOS wafer can be align bonded to a n-channel MOS wafer to produce a vertical CMOS device. This offers the advantage that the n- and p- channel wafers are fabricated separately, thus reducing process complexity, and providing a technology which is dielectrically isolated and totally latch up free.

Figure 5:
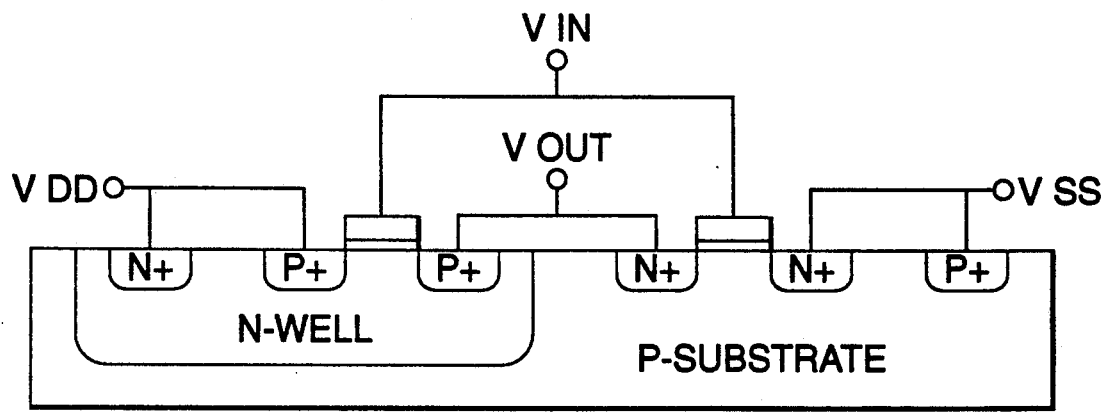
FIG. 5 is a schematic cross-sectional view of a monolithic CMOS device fabricated using conventional methods.
Figure 6:
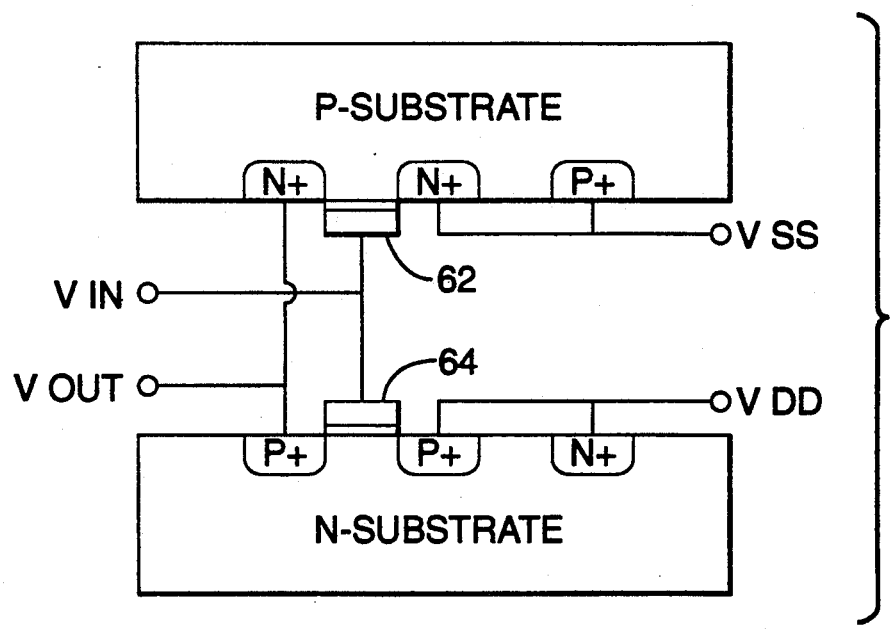
FIG. 6 is a schematic cross-sectional exploded view of the CMOS device of FIG. 5 fabricated using the process of FIG. 1.

Referring now to FIG. 5, there is shown a schematic cross-sectional view of a monolithic CMOS invertor fabricated using conventional N-well technology. FIG. 6 shows a device with the same function but which is fabricated using the process of the present invention. In FIG. 6, the conductive bonding micropads 62, 64 are selectively align-bonded between the prefabricated wafers. $TiSi_2$ or PtSi is used as the interconnect and bonding agent between the wafers. The unbonded surfaces are covered with a PECVD $Si_3N_4$ prior to align bonding steps to serve as a passivation layer. The bonding micropads are fabricated onto field oxide regions where silicide fusion bonding takes place.

Figure 7:
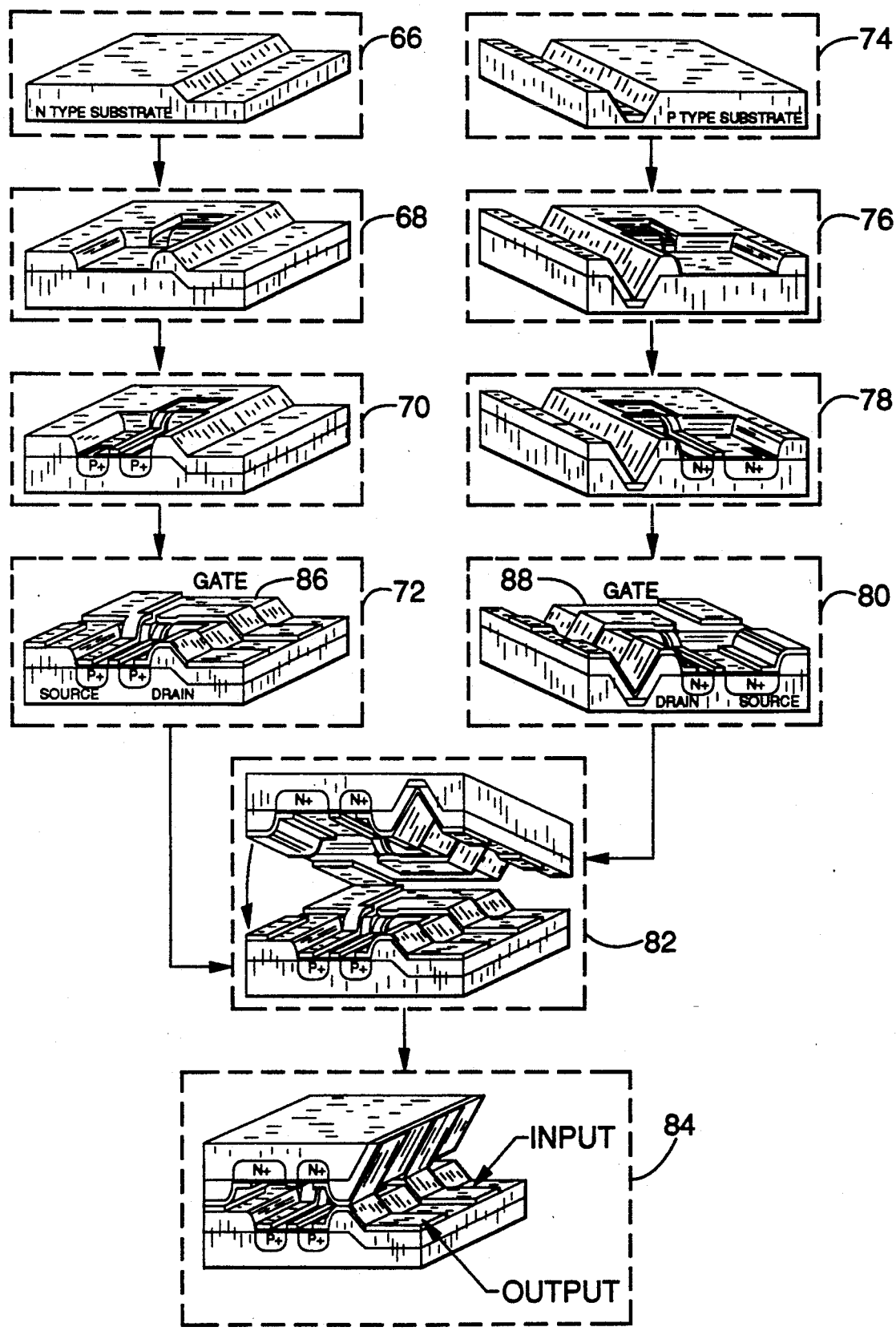
FIG. 7 is a process flow diagram showing the fabrication of a typical CMOS device using the process of FIG. 1.

Referring to FIG. 7, steps 66 through 80 schematically show p- and n- MOS processing steps which are conventional, but which include special attention to polysilicon etching and recessed gate pads 86, 88 imbedded in the field oxide. The processed p- and n- wafers then receive appropriate surface treatments for aligned bonding as shown in steps 82 and 84.

An extension of align-bonded CMOS devices is the fabrication of align-bonded Bi-CMOS devices. In one embodiment, a CMOS device with exposed contact studs made of either a metal silicide or other refractory conductor forming a plane would be align bonded to a bipolar wafer with associated conductive studs. With this approach, the CMOS and/or bipolar technologies could be independently optimized as desired. An example would be an SOI CMOS structure. The structure would then be a three layer structure which is thinned after each wafer is added. Another embodiment would be to align bond a CMOS wafer to a bipolar wafer where the conductive pads form the mechanical and electrical connection between the circuitry in the same manner as the n- and p- mos are align bonded in the CMOS case.

A further extension would be to use Aligned Wafer Bonding to fabricate integrated analog to digital devices, high power to low power devices, and the like. Aligned Wafer Bonding would be particularly suited for this application since the individual devices are the products of dissimilar processes and do not lend themselves to monolithic fabrication. In this extension, a planar conductive bonding surface would be formed by a patterned layer of a metal silicide, refractory metal, or polysilicon which forms contacts between the wafers and mechanically bonds the structures.

In the case of integrated bipolar devices, it is generally difficult to fabricate monolithic npn and pnp bipolar transistors of high gain or speed on a single chip of semiconductor material. This is because the base width and doping for either npn or pnp transistors must be carefully controlled to achieve high gain or speed. It is relatively straightforward to control the fabrication of either a p-type base in an npn or an n-type base in a pnp transistor, but very difficult to achieve both in a single process sequence. By separately fabricating the npn and pnp portions of the structures, each transistor type can be optimized prior to integration by aligned wafer bonding.

Integrated microsensors is another application of aligned wafer bonding. While it is often that case that microsensors and integrated circuits are made from the same materials, the specific processes and economics of the microsensors and integrated circuits are so different that their integration onto a common substrate is not practical. Microsensor and integrated circuit technologies can be combined by providing a patterned conductive plane on each to electrically interconnect and mechanically bond the circuitry to the microsensors with aligned wafer bonding. Similarly, microactuators such as gears and switches could be combined with electronic circuitry monolithically included in the overall design of a specific function. As is the case with microsensor technologies, the specific processes and economics of microactuator and integrated circuit technologies do not blend well into an integrated monolithic technology. The process of the present invention can be used to integrate these technologies after separate fabrication and optimization. Photonic technologies can also be bonded in this manner.

Figure 8:
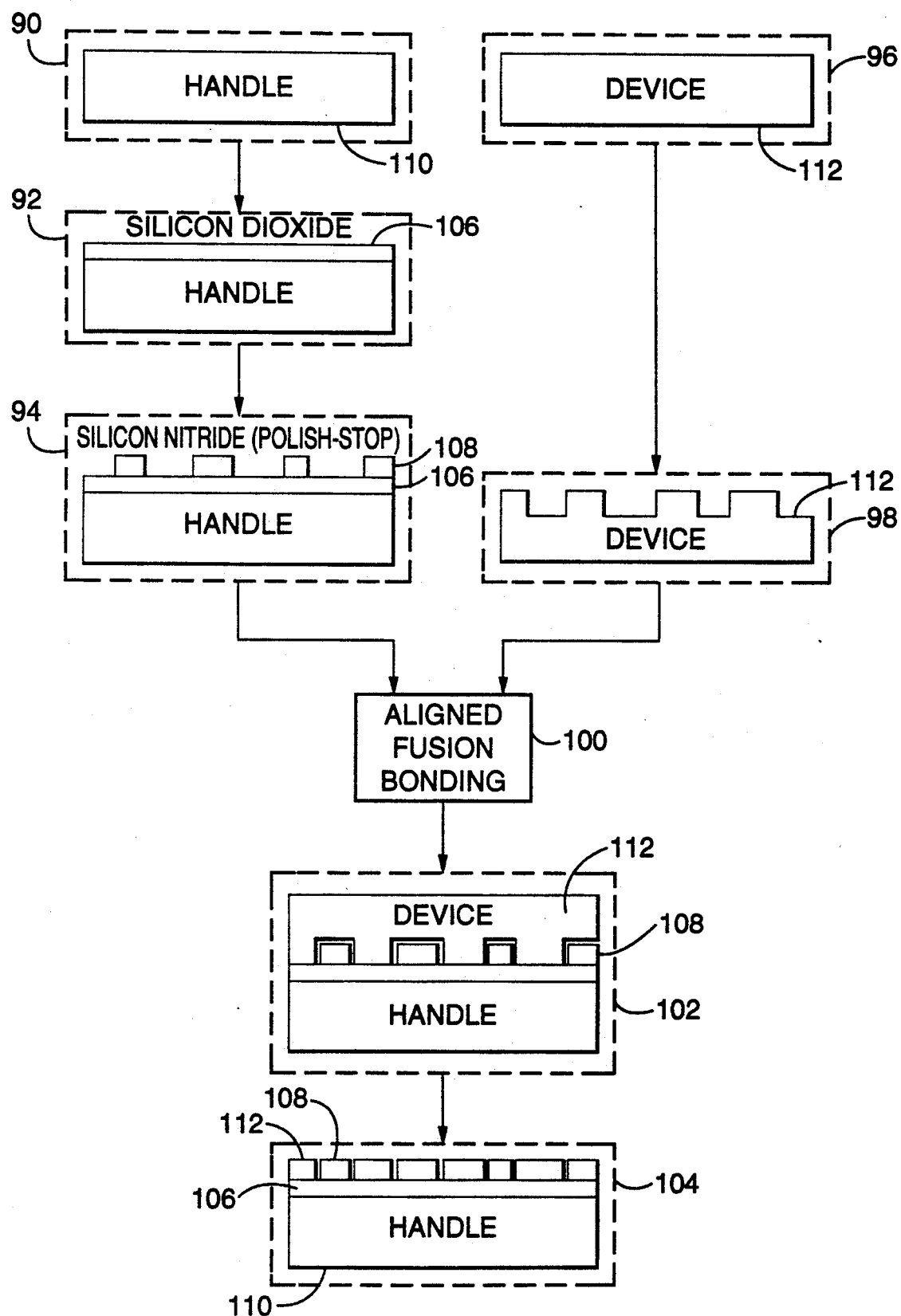
FIG. 8 is a process flow diagram showing a cross-sectional view of the fabrication of a silicon o insulator device using the process of FIG. 1.

Referring now to FIG. 8, it can be seen that a silicon-on-insulator (SOI) structure can be fabricated using Aligned Wafer Bonding. Steps 90 through 94 show the conventional process for preparing an insulator handle. At step 90, an insulator handle 110 is prepared. Note that in step 92, a layer 106 of $SiO_2$ is deposited on the insulator handle 110 to act serve as a bonding intermediate. In step 94, $Si_3N_4$ is pattern deposited to serve as polish stops 108. At step 100, the silicon based device 112 of step 98 is Align Wafer Bonded to the layer 106 of $SiO_2$, to form the silicon-on-insulator structure of step 102. At step 104 the device 112 is thinned to the level of the polish stops 108.

Extensions of the foregoing techniques are vast. For example, semiconductor and other "chips" could be aligned bonded in addition to entire wafer-like structures. Or, a common "mother-wafer" could be fabricated using Aligned Wafer Bonding with subsequent Aligned Wafer Bonding of individual circuit or micromechanical structures to the "mother-wafer." In addition, by repeating the process steps of Aligned Wafer Bonding as shown in FIG. 1 for a plurality of wafers or structures, multilayered circuits and structures could be fabricated. For example, two structures would be initially bonded with Aligned Wafer Bonding and one of the two structures thinned. A third structure would then be bonded to the thinned surface, and that third structure thinned. The process would continue until the desired multilayered structure was formed. Those skilled in the art will appreciate the variety of applications which are available using Aligned Wafer Bonding.

Accordingly, it will be seen that this invention provides for the fabrication of complex integrated devices that could include mechanical, electronic and/or optical elements formed in separate prefabricated layers. Although the description above contains many specificities, these should not be construed as limiting the scope of the invention but as merely providing illustrations of some of the presently preferred embodiments of this invention. Thus the scope of this invention should be determined by the appended claims and their legal equivalents.

I claim:

1. A process for bonding a surface feature of a semiconductor structure to a surface feature of a semiconductor, optical, or micromechanical structure, comprising the steps of:
   (a) aligning at least two complementary surface features of a plurality of structures having surface features to be bonded;
   (b) bringing said surface features into physical contact at room temperature whereby atomic bonds are formed between said surface features; and
   (c) annealing said structures to strengthen said atomic bonds.

2. The process of claim 1, wherein said alignment is within approximately five micrometers.

3. The process of claim 1, further comprising the steps of repeating steps (a) through (c) for a plurality of structures to be bonded whereby multilayered structures are formed.

4. The process of claim 1, further comprising the steps
   (a) positioning said surfaces in close proximity;

5. The process of claim 1, wherein said structures are silicon wafers.
   (b) passing beams of infrared light through said structures and projecting an infrared image of said surfaces to a viewing screen; and
   (c) viewing said infrared image for rotational and translational alignment of said alignment marks.

6. A method of directly bonding silicon based surface features of electrical, micromechanical and optical structures, comprising the steps of:
   (a) establishing a plurality of alignment marks on the surfaces of at least two structures having complementary silicon based surface features to be bonded;
   (b) positioning said surfaces to oppose each other in close proximity while said surface features lie in substantially the same plane;
   (c) passing beams of infrared light through said structures and projecting an infrared image of said surface features to a viewing screen;
   (d) viewing said infrared image and superimposing said alignment marks by bringing said alignment marks into rotational and transitional alignment;
   (e) bringing said surface features into physical contact whereby an atomic bond is formed; and
   (f) annealing said surface features to strengthen said bond.

7. The process of claim 6, wherein said alignment marks comprise a plurality of orthogonal anisotropically etched V-shaped grooves.

8. The process of claim 7, wherein said alignment marks are etched with potassium hydroxide.

9. The process of claim 6, further comprising the steps of cleaning and hydrating said surfaces.

10. A method of fabricating a semiconductor device, comprising the steps of
    (a) establishing at least one alignment mark on the first surface of a first structure having first and second surfaces;
    (b) establishing at least one alignment mark on the first surface of a second structure having first and second surfaces;
    (c) positioning said first surfaces of said first and second structures to oppose each other in close proximity while said surfaces lie in substantially the same plane;
    (d) passing infrared light through said structures and projecting an infrared image of said first surfaces to a viewing screen;
    (e) viewing said infrared image and superimposing said alignment marks by bringing said alignment marks into rotational and transitional alignment;
    (e) bringing said first surfaces of said structures into physical contact whereby an atomic bond is formed between said surfaces; and
    (f) annealing said bonded surfaces to strengthen said bond.

11. The process of claim 10, wherein said first structure comprises a n-channel metal oxide semiconductor wafer.

12. The process of claim 11, wherein said second structure comprises a p-channel metal oxide semiconductor wafer.

13. The process of claim 10, wherein said first surface of said first structure includes a material selected from the group consisting of Si, $SiO_2$, $Si_3N_4$, PtSi, $TiSi_2$, and polysilicon.

14. The process recited in claim 12, wherein said first surface of said second structure includes a material selected from the group consisting of Si, $SiO_2$, $Si_3N_4$, PtSi, $TiSi_2$, and polysilicon.

15. The process recited in claim 13, wherein said second structure comprises an electrical insulating material.

16. The process recited in claim 12, further comprising the steps of:
(a) etching an array of alignment marks into the first surface of a bipolar semiconductor structure having first and second surfaces;
(b) bonding said bipolar semiconductor structure to at least one of said first and second structures.

17. The process recited in claim 10, wherein said first structure includes analog circuitry.

18. The process recited in claim 17, wherein said second structure includes digital circuitry.

19. The process recited in claim 10, wherein said first structure includes an npn transistor.

20. The process recited in claim 19, wherein said second structure includes a pnp transistor.

21. The process recited in claim 10, wherein said first structure is electrically coupled to a microsensor.

22. The process recited in claim 10, wherein said first structure is electrically coupled to a microactuator.

23. The process recited in claim 10, wherein said first structure is electrically coupled to a photosensor.

* * * * *

UNITED STATES PATENT AND TRADEMARK OFFICE
CERTIFICATE OF CORRECTION

PATENT NO. : 5,236,118
DATED : August 17, 1993
INVENTOR(S) : Robert W. Bower; Mohd Salleh Ismail It is certified that error appears in the above-indentified patent and that said Letters Patent is hereby corrected as shown below:

Column 3, line 14, change "o" to --on--.

Column 4, line 37, delete "10".

Column 5, line 41, change "o" to --of--.

Column 9, line 59, after "steps" insert --of:--.

Column 9, delete lines 62-63.

Column 9, line 68 after "marks." insert

--5. The process of claim 1, wherein said structures are silicon wafers.--.

Column 10, line 29, after "of" insert --:--.

Signed and Sealed this

Twenty-sixth Day of April, 1994

Attest:

BRUCE LEHMAN

*Attesting Officer*     *Commissioner of Patents and Trademarks*